US011228325B2

(12) United States Patent
Bellaouar et al.

(10) Patent No.: US 11,228,325 B2
(45) Date of Patent: Jan. 18, 2022

(54) MULTIBAND RECEIVERS FOR MILLIMETER WAVE DEVICES (71) Applicant: GLOBALFOUNDRIES INC., Grand Cayman (KY)

(72) Inventors: Abdellatif Bellaouar, Richardson, TX (US); Sher Jiun Fang, Allen, TX (US); Frank Zhang, Allen, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 100 days.

(21) Appl. No.: 16/833,663

(22) Filed: Mar. 30, 2020

(65) Prior Publication Data

US 2020/0228149 A1 Jul. 16, 2020

Related U.S. Application Data (63) Continuation of application No. 15/967,281, filed on Apr. 30, 2018, now Pat. No. 10,944,437.
(Continued)

(51) Int. Cl.
*H04B 1/00* (2006.01)
*H04B 1/16* (2006.01)
(Continued)

(52) U.S. Cl.
CPC .............. *H04B 1/005* (2013.01); *H03F 3/195* (2013.01); *H03G 3/3042* (2013.01);
(Continued)

(58) Field of Classification Search
CPC .......... H04B 1/005; H04B 1/16; H03F 3/195; H03F 2200/294; H03F 2200/451;
(Continued)

(56) References Cited

U.S. PATENT DOCUMENTS 9,294,264 B2     3/2016 Endo et al.
10,411,745 B1 *  9/2019 Huang .................... H03F 1/56
(Continued)

FOREIGN PATENT DOCUMENTS

WO     2014054908 A1    4/2014

OTHER PUBLICATIONS

S. Bonkers, Wireless Receiver Architecture Towards 5G: Where Are We?, IEEE Circuits and Systems Magazine, pp. 6-16, Aug. 2017.
(Continued)

*Primary Examiner* — Fayyaz Alam
(74) *Attorney, Agent, or Firm* — Williams Morgan, P.C.

(57) ABSTRACT

We disclose multiband receivers for millimeter-wave devices, which may have reduced size and/or reduced power consumption. One multiband receiver comprises a first band path comprising a first passive mixer configured to receive a first input RF signal having a first frequency and to be driven by a first local oscillator signal having a frequency about ⅔ the first frequency; a second band path comprising a second passive mixer configured to receive a second input RF signal having a second frequency and to be driven by a second local oscillator signal having a frequency about ⅔ the second frequency; and a base band path comprising a third passive mixer configured to receive intermediate RF signals during a duty cycle and to be driven by a third local oscillator signal having a frequency about ⅓ the first frequency or about ⅓ the second frequency during the duty cycle.

20 Claims, 8 Drawing Sheets

Related U.S. Application Data (60) Provisional application No. 62/655,629, filed on Apr. 10, 2018.

(51) Int. Cl.
  *H03L 7/099* (2006.01)
  *H03F 3/195* (2006.01)
  *H03G 3/30* (2006.01)
  *H03F 1/08* (2006.01)

(52) U.S. Cl.
  CPC ............. *H03L 7/0992* (2013.01); *H04B 1/16* (2013.01); *H03F 1/08* (2013.01); *H03F 2200/267* (2013.01); *H03F 2200/294* (2013.01); *H03F 2200/451* (2013.01); *H03L 2207/50* (2013.01)

(58) Field of Classification Search
  CPC ....... H03G 3/3042; H03L 7/0992; H04F 1/08; H04F 2200/267
  See application file for complete search history.

(56) References Cited

U.S. PATENT DOCUMENTS

| | | | |
|---|---|---|---|
| 2007/0066254 A1 | 3/2007 | Tsuchie et al. | |
| 2014/0378077 A1 | 12/2014 | Din et al. | |
| 2015/0173091 A1 | 6/2015 | Ratasuk et al. | |
| 2019/0312604 A1* | 10/2019 | Huang | H01Q 1/247 |
| 2020/0091608 A1* | 3/2020 | Alpman | H01Q 1/38 |

OTHER PUBLICATIONS

J. Paramesh, et al.; Wideband Millimeter-wave Beamforming Receivers in Silicon; Carnegie Mellon University; WSO: Towards 5G: Circuits, Systems, MIMO, and Beamforming IMS/RFIC Workshop, Phoenix, Arizona, May 17, 2015; pp. 1-34.

Office Action dated Oct. 31, 2019 of co-pending U.S. Appl. No. 15/967,281, filed Apr. 30, 2018.

* cited by examiner

MULTIBAND RECEIVERS FOR MILLIMETER WAVE DEVICES

BACKGROUND OF THE INVENTION

Field of the Invention

Generally, the present disclosure relates to sophisticated semiconductor devices, and, more specifically, to multiband receivers for millimeter wave devices.

Description of the Related Art

There have been many advances in devices that use millimeter wave (mm-wave) signals. Semiconductor devices that involve mm-wave applications include devices that operate based on the electromagnetic spectrum of radio band frequencies in the range of about 30 Gigahertz (GHz) to about 300 GHz. The mm-wave radio waves have a wavelength in the range of 1 millimeter (mm) to about 10 mm, which corresponds to a radio frequency of 30 GHz to about 300 GHz. This band of frequencies is sometimes referred to as extremely high frequency (EHF) frequency band range. Examples of applications of mm-wave application include radar devices, high-speed communication devices (e.g., wireless gigabit (WiGig) devices), etc. Radar devices have been implemented in various applications such as vehicle safety and automation applications.

Implementing mm-wave applications produces many challenges when designing circuits for these applications. For example, new standards in wireless communications systems (e.g., the 5G standard) require multiband receivers. Known multiband receivers have undesirably high power consumption and undesirably large size for use in contemporary devices. These problems are particularly pronounced for millimeter wave devices, such as vehicular radar devices, 5G telecommunication devices, and the like.

Attempts to form multiband receivers have generally included one differential passive mixer driven by a local oscillator signal having a frequency equal to the frequency of the input radio frequency (RF) signal. For example, an input RF signal at 28 GHz requires a local oscillator signal at 28 GHz to drive the differential passive mixer. However, a differential passive mixer contains two mixers, one to mix the "I" component of the input RF signal and the other to mix the "Q" component of the input RF signal. To provide a local oscillator signal of e.g., 28 GHz to each of the I and Q mixers, an initial local oscillator signal of e.g., 56 GHz must be generated by e.g. a digital phase locked loop (DPLL) and distributed to the differential passive mixer. Distributing a signal of such high frequency may cause various problems, such as consumption of an undesirably large amount of power, signal crosstalk, signal transmission errors, etc.

It would be desirable to have a multiband receiver that may allow one or more of reduced size or reduced power consumption.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment, the present disclosure is directed to an apparatus, comprising a first band path comprising a first passive mixer configured to receive a first input radio frequency (RF) signal having a first frequency, wherein the first passive mixer is driven by a first local oscillator signal having a frequency about two-thirds of the first frequency, and is configured to provide a first intermediate RF signal having a frequency about one-third of the first frequency; a second band path comprising a second passive mixer configured to receive a second input RF signal having a second frequency, wherein the second passive mixer is driven by a second local oscillator signal having a frequency about two-thirds of the second frequency, and is configured to provide a second intermediate RF signal having a frequency about one-third of the second frequency; and a base band path comprising a third passive mixer configured to receive the first intermediate RF signal during a first period of a duty cycle and the second intermediate RF signal during a second period of the duty cycle, wherein the third passive mixer is driven by a third local oscillator signal having a frequency about one-third of the first frequency during the first period, is driven by a fourth local oscillator signal having a frequency about one-third of the second frequency during the second period, is configured to provide a first differential output signal having a frequency about one-third of the first frequency during the first period, and is configured to provide a second differential output signal having a frequency about one-third of the second frequency during the second period.

In one embodiment, the present disclosure is directed to an apparatus, comprising: a first band path, comprising a first passive mixer configured to receive a first input radio frequency (RF) signal having a first frequency, wherein the first passive mixer is driven by a first local oscillator signal having a frequency about two-thirds of the first frequency, and is configured to provide a first intermediate RF signal having a frequency about one-third of the first frequency; and a second passive mixer configured to receive the first intermediate RF signal, wherein the second passive mixer is driven by a second local oscillator signal having a frequency about one-third of the first frequency, and is configured to provide a first differential output signal having a frequency about one-third of the first frequency; and a second band path, comprising a third passive mixer configured to receive a second input RF signal having a second frequency, wherein the third passive mixer is driven by a third local oscillator signal having a frequency about two-thirds of the second frequency, and is configured to provide a second intermediate RF signal having a frequency about one-third of the second frequency; and a fourth passive mixer configured to receive the second intermediate RF signal, wherein the fourth passive mixer is driven by a fourth local oscillator signal having a frequency about one-third of the second frequency, and is configured to provide a second differential output signal having a frequency about one-third of the second frequency.

In one embodiment, the present disclosure is directed to a manufacturing system, configured to manufacture an apparatus, such as one or more of the apparatus mentioned above.

Embodiments herein may provide multiband receiver circuits with one or more of reduced size or reduced power consumption.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for multiband receivers for millimeter wave (mm-wave) devices with one or more of lower size and lower power consumption.

Figure 1:
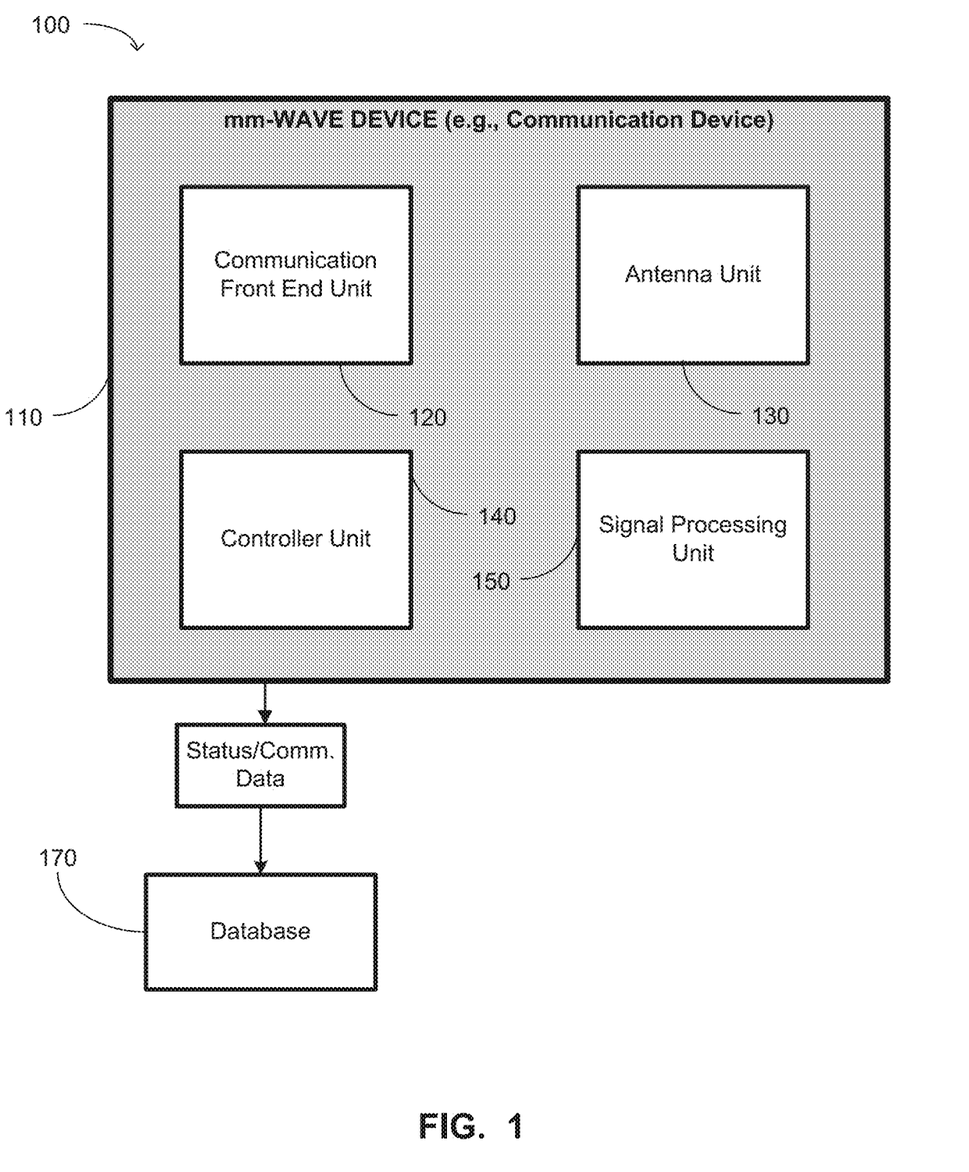
FIG. 1 illustrates a stylized block diagram representation of a mm-wave communication system, in accordance with embodiments herein.

For ease of illustration, embodiments herein is depicted within the context of a communication device, however, those skilled in the art would readily appreciate that the concepts disclosed herein may be implemented in other types of devices, such as radar devices, network devices, high-definition video devices, etc. Turning now to FIG. 1, a stylized block diagram representation of an mm-wave system, in accordance with embodiments herein, is illustrated.

A system 100 may comprise an mm-wave device 110 and a database 170. The mm-wave device 110 may be a communication device or alternatively, a radar device, a wireless communication device, a data network device, a video device, or the like. For illustrative purposes and for the sake of clarity and ease of description, the mm-wave device 110 is described in the context of a 5G or WiGig communication application; as such, the mm-wave device 110 may also be referred to below as a communication device 110. However, those skilled in the art having benefit of the present disclosure would appreciate that the concepts described herein may be applied to a variety of type of mm-wave applications, including vehicle applications using radar signals, wireless network applications, data network applications, video and audio applications, etc.

The communication device 110 is capable of transmitting a first communication signal, receiving a second communication signal, and processing the second communication signal.

The mm-wave device 110 may comprise a communication unit front end unit 120, an antenna unit 130, a controller unit 140, and a signal processing unit 150. The communication front end unit 120 may comprise a plurality of components, circuit, and/or modules, and is capable of sending, receiving, and processing communication signals. In one embodiment, the mm-wave device 110 may be encompassed into a single integrated circuit (IC) chip. In some embodiments, the mm-wave device 110 may be formed on a plurality of integrated circuits that are positioned on a single IC chip. In other embodiments, mm-wave device 110 may be formed on single integrated circuit, which is shrouded into an IC chip.

The communication front end unit 120 is capable of providing an output signal, e.g., a first communication signal. In one embodiment, the frequency range of the communication signals processed by the mm-wave device 110 may be in the range of about 10 GHz to about 90 GHz.

A more detailed description of the communication front end unit 120 is provided in FIG. 3 and accompanying description below.

In the example where the mm-wave device 110 is a communication device, the communication front end unit 120 may be a network communications front end unit. In this embodiment, the mm-wave device 110 may process network communications for various types of communication applications, such as packet data network communications, wireless (e.g., cellular communications, IEEE 802.11ad WiGig Technology, etc.), data communications, etc. The concepts disclosed herein may also be utilized for other types of applications, such as network communications, wireless communications, high-definition video, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the first communication signal, while the receiver antennas are used for receiving the second communication signal. A more detailed description of the antenna unit 130 is provided in FIG. 7, and accompanying description below.

Continuing referring to FIG. 1, the mm-wave device 110 may also comprise a signal processing unit 150. The signal processing unit is capable of performing various analog and/or digital processing of the signals that are transmitted and/or received by the mm-wave device 110. For example, the first communication signal transmitted by the mm-wave device 110 may be amplified prior to its transmission. Further, the second communication signal received by the mm-wave device 110 may be sent through one or more analog filter stages. The received communication signals may then be converted to a digital signal by one or more analog-to-digital converters (DAC) in the signal processing unit 150. Digital signal processing (DSP) may be performed on the digitized signal. A more detailed description of the signal processing unit 150 is provided in FIG. 6 and accompanying description below.

Continuing referring to FIG. 1, the mm-wave device 110 may also comprise a controller unit 140. The controller unit 140 may perform various control operations of the mm-wave device 110. These functions include generating a communication signal, transmitting the communication signal, receiving an incoming communication signal, and processing the incoming communication signal Turning now to FIG. 2, a stylized block diagram description of the controller unit 140, in accordance with embodiments herein, is provided. The controller unit 140 may comprise a processor unit 230 capable of controlling various function of the device 110. The processor unit 230 may comprise a microprocessor, a microcontroller, a field programmable gate array (FPGA), an application-specific integrated circuit (ASIC), and/or the like.

Figure 2:
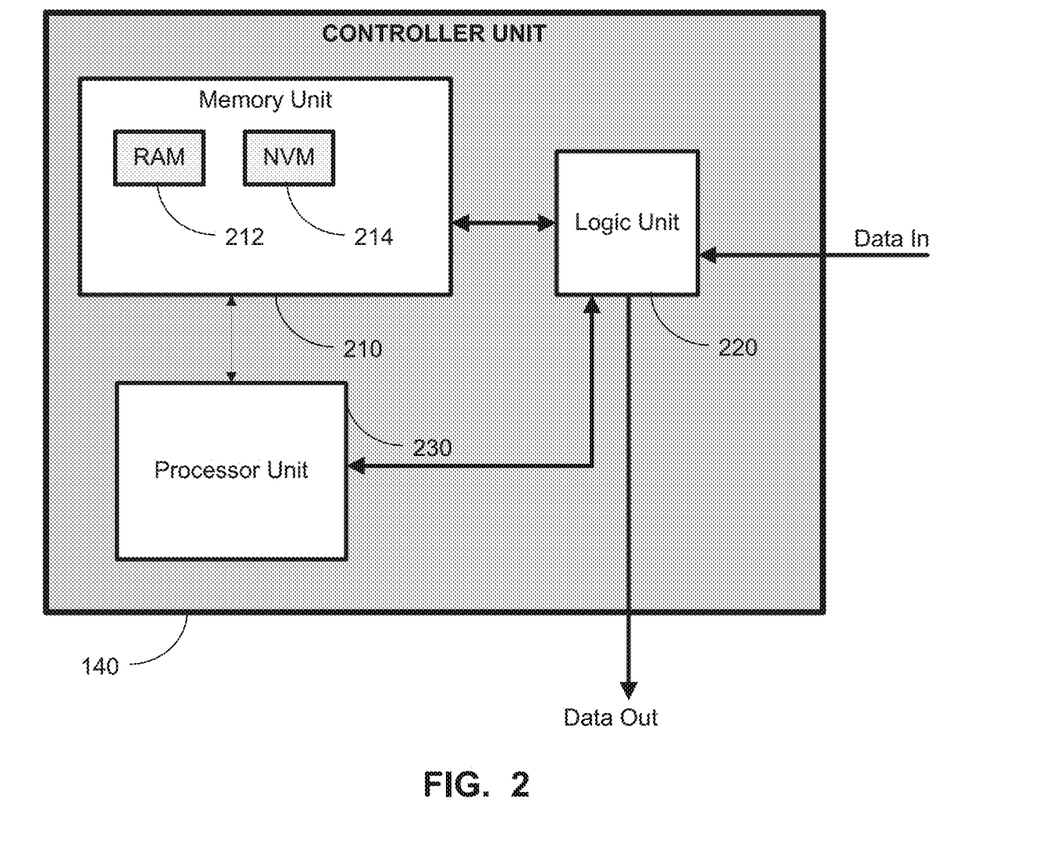
FIG. 2 illustrates a stylized block diagram description of the controller unit 140, in accordance with embodiments herein.

The controller unit 140 may also comprise a logic unit 220. The logic unit 220 may comprise a circuit that is capable of performing various logic operations, receiving data, and/or performing interface functions with respect to input data (data_in) and output data (data_out). The signal data_in may represent data derived from processing and analyzing a received communication signal. The data_out signal may represent data generated for a transmitted communication signal.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters for controlling operations of the device 110. The memory unit 210 may also store data that may be used to program any FPGA devices in the mm-wave device 110. As such, the memory unit 210 may be subdivided into a program data memory, a status data memory, and a reaction data memory. This subdivision may be performed logically, or physically.

Figure 3:
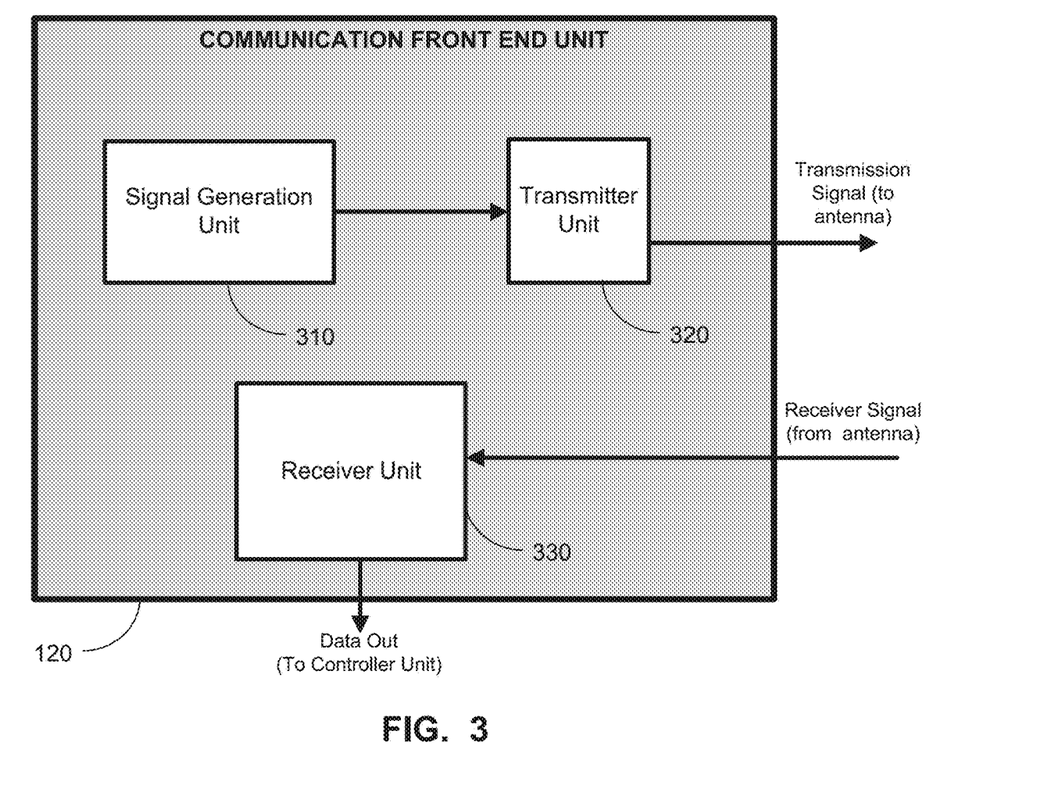
FIG. 3 illustrates a stylized block diagram depiction of the communication front end unit of FIG. 1, in accordance with embodiments herein, is illustrated.

Turning now to FIG. 3, a stylized block diagram depiction of the communication front end unit 120, in accordance with embodiments herein, is illustrated. The communication front end unit 120 may comprise a signal generation unit 310, a transmitter unit 320, and a receiver unit 330. The signal generation unit 310 is capable of generating a communication signal at a predetermined frequency. For example, a signal in the range of about 70 GHz to about 85 GHz may be generated. The signal generation unit 310 is capable of providing a communication signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a communication signal to be transmitted to the antenna unit 130.

Figure 4:
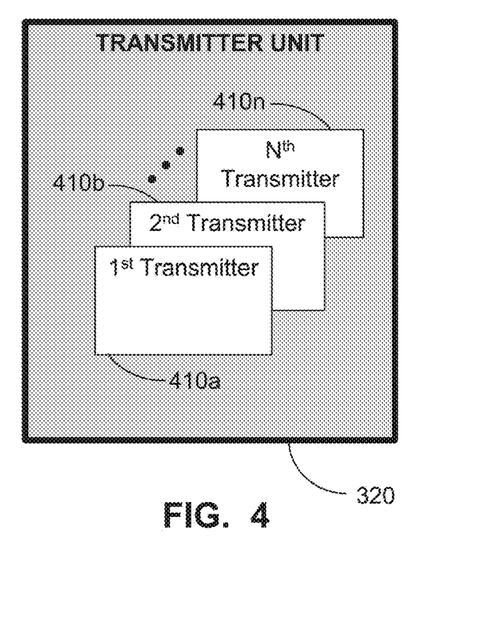
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410a, a $2^{nd}$ transmitter 410b, through an $N^{th}$ transmitter 410n (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the through $N^{th}$ transmitters 410. For example, the signal generation unit 310 may provide a signal transmit signal for each transmitter 410, or alternatively, a $1^4$ transmit signal for a first set of transmitters 410 and a $2^{nd}$ transmit signal for a second set of transmitters 410.

Continuing referring to FIG. 3, a received signal (i.e., a received communication signal) is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP; however, in other embodiments, these tasks may be performed by the receiver unit 330. The receiver unit 330 is capable of directing data_out to the controller unit 140.

Figure 5:
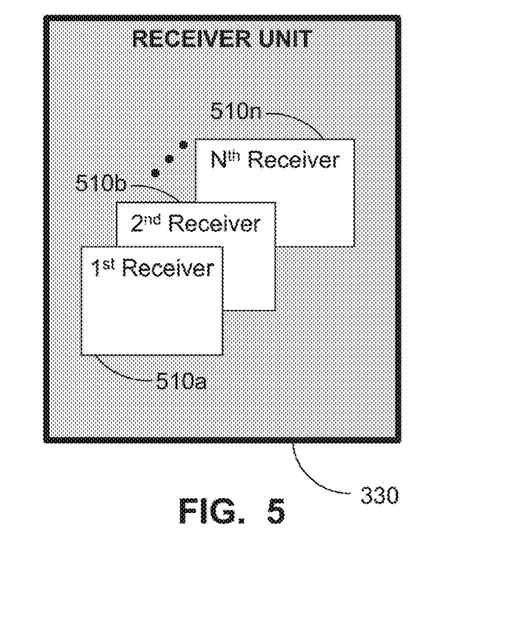
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may comprise a plurality of similar receivers, i.e., a $1^{st}$ receiver 510a, a $2^{nd}$ receiver 510b, through an $N^{th}$ receiver 510n (collectively "510"). In one embodiment, the $1^{st}$ through $N^{th}$ receiver 510 may each process a single signal from the signal generation unit 310 and provide the signal to the controller unit 140. In another embodiment, the may provide a plurality of signals to the through $N^{th}$ receiver 510. For example, the antenna unit 130 may provide a signal to each receiver 510, or alternatively, a 1⁴ receiver signal for a first set of receivers 510 and a $2^{nd}$ receiver signal for a second set of receivers 510.

Figure 6:
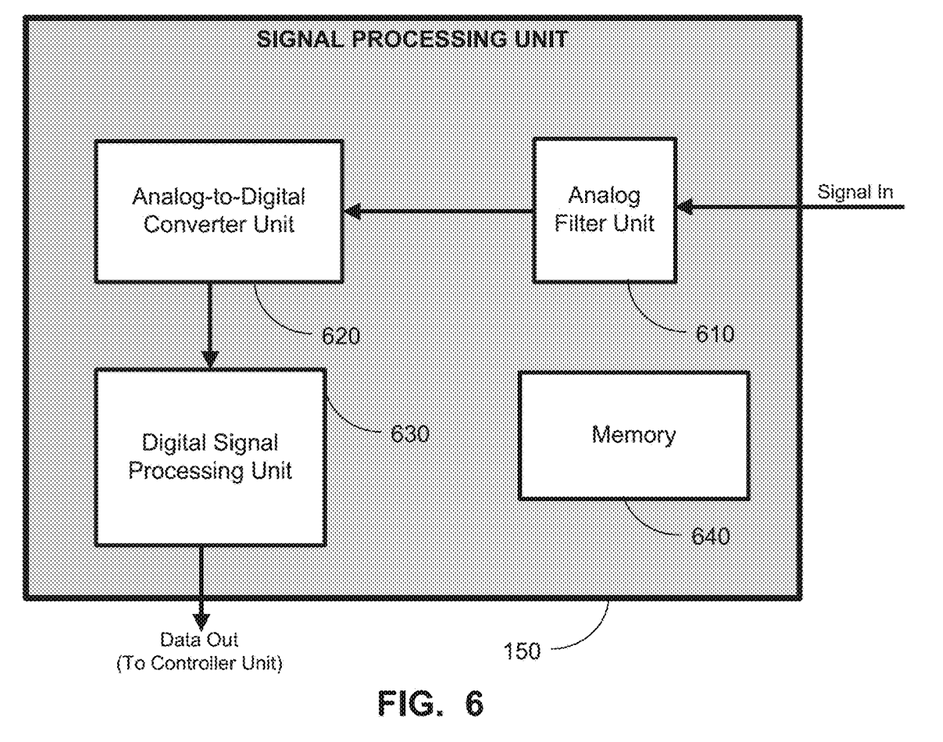
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 610 may be a first-in-first-out (FIFO) memory. In other cases, the processed digital output from the DSP unit 630 may be stored in the memory unit 210 of the controller unit 140.

Figure 7:
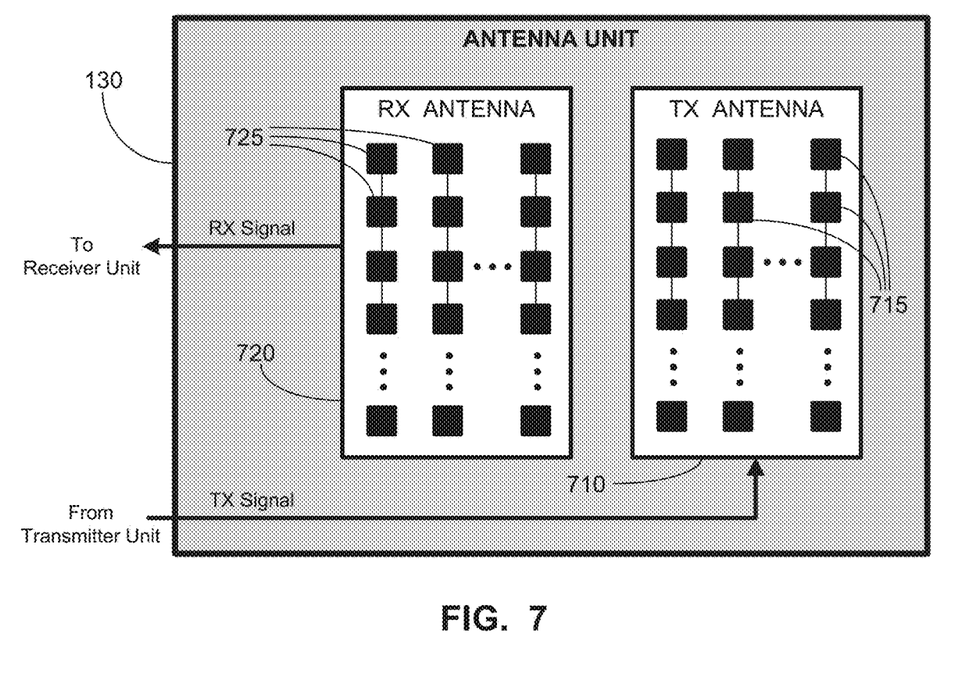
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

The person of ordinary skill in the art will be aware of modifications that may be made to the exemplary embodiments depicted in FIGS. 2-7 as a routine matter.

Figure 8:
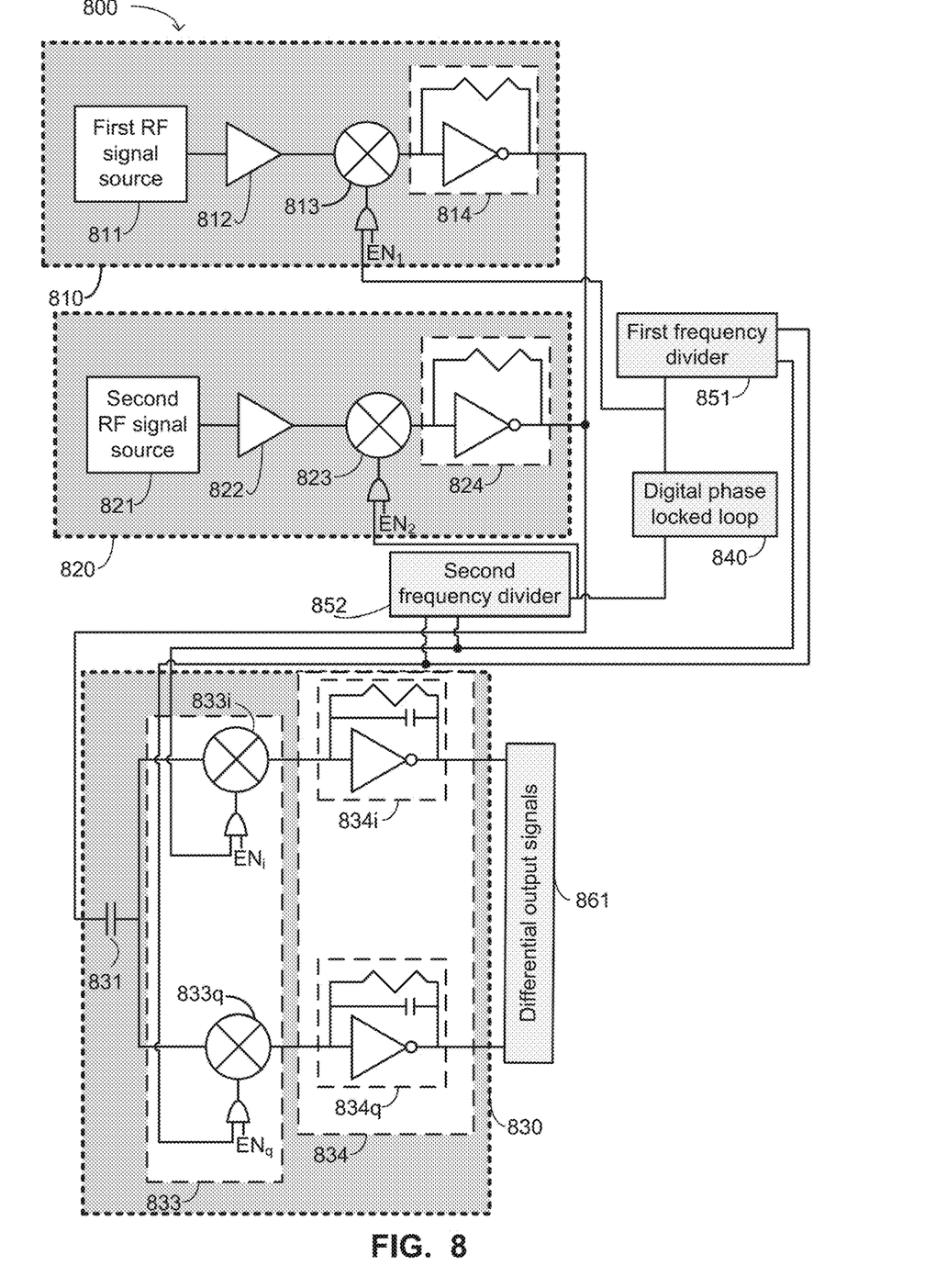
FIG. 8 illustrates a first multiband receiver circuit, in accordance with embodiments herein.

FIG. 8 depicts an implementation of a first multiband receiver 800, in accordance with embodiments herein. The first multiband receiver 800 comprises a first band path 810. The first band path 810 comprises a first passive mixer 813 configured to receive (e.g., from a first RF signal source 811) a first input radio frequency (RF) signal having a first frequency.

Although not shown in FIG. 8, the first RF signal source 811 may comprise a switch actuated by a signal from a transmitter, such that the first band path 810 only receives the first input RF signal from upstream components (not shown) when the transmitter is not transmitting. The first input RF signal may be amplified by a first low noise amplifier 812 prior to being provided to the first passive mixer 813.

In one embodiment, the first frequency may be about 28 GHz, e.g., from 24.25 GHz to 29.50 GHz. In one embodiment, the first frequency may be about 40 GHz, e.g., from 37 GHz to 43.5 GHz. In one embodiment, the first frequency may be a frequency within a first frequency range specified by a 5G telecommunications standard.

The first passive mixer 813 is driven by a first local oscillator signal, such as may be provided by a digital phase locked loop (DPLL) 840, and controlled by a first enable signal ($EN_1$). The first local oscillator signal may have a frequency about two-thirds of the first frequency. In one embodiment, if the first frequency is about 28 GHz, the frequency of the first local oscillator signal may be about 18 GHz. For example, if the first frequency is in the range from 24.25 GHz to 29.50 GHz, the frequency of the first local oscillator signal may be from 16.17 GHz to 19.67 GHz.

The first passive mixer 813 is configured to provide a first intermediate RF signal having a frequency about one-third of the first frequency. In one embodiment, if the first frequency is about 28 GHz, the frequency of the first intermediate RF signal may be about 9 GHz (e.g., from 8.08 GHz to 9.83 GHz).

For convenience, the architecture of the first band path 810 is depicted in FIG. 8 as receiving a single-ended input. As the person of ordinary skill in the art having benefit of the present disclosure will readily comprehend, the first band path 810 may be configured to receive a differential input. The first band path 810 may provide a single-ended output or alternatively, a differential output. As will be discussed below, as depicted in FIG. 8, the first band path 810 provides a differential first intermediate RF signal comprising "I" and "Q" components having a 90° phase shift therebetween.

In one embodiment, such as is depicted in FIG. 8, the first band path 810 may further comprise a first gain stage 814 configured to increase the gain of the first intermediate RF signal. The first gain stage 814 may comprise an inverter and a feedback resistor.

In one embodiment, one or more of the components 812, 813, or 814 of the first band path 810 may be a fully depleted silicon on insulator (FDSOI) device. Implementing one or more components of the first multiband receiver 800 as an FDSOI device may be appropriate when sensitivity to parasitics at the first gain stage 814 and a second gain stage 824 described below is a factor which the person of ordinary skill in the art wishes to take into account.

The first multiband receiver 800 also comprises a second band path 820 comprising a second passive mixer 823 configured to receive (e.g., from a second RF signal source 821) a second input RF signal having a second frequency. The second frequency may be a frequency within a first frequency range specified by a 5G telecommunications standard, such as about 28 GHZ or about 40 GHz. The second frequency differs from the first frequency.

Although not shown in FIG. 8, the second RF signal source 821 may comprise a switch actuated by a signal from a transmitter, such that the second band path 820 only receives the second input RF signal from upstream components (not shown) when the transmitter is not transmitting. Also, the first RF signal source 811 and the second RF signal source 822 may be controlled such that only one of the first band path 810 and the second band path 820 is enabled at any one time. The second input RF signal may be amplified by a second low noise amplifier 822 prior to being provided to the second passive mixer 823.

The second passive mixer 823 is driven by a second local oscillator signal, such as may be provided by DPLL 840, and controlled by a second enable signal ($EN_2$). The second local oscillator signal may have a frequency about two-thirds of the second frequency. For example, if the second frequency is about 40 GHz (e.g., from 37 GHz to 43.5 GHz), the second local oscillator signal may be about 27 GHz (e.g., from 24.6 GHz to 29 GHz).

The second passive mixer 823 is configured to provide a second intermediate RF signal having a frequency about one-third of the second frequency. In one embodiment, if the second frequency is about 40 GHz, the frequency of the second intermediate RF signal may be about 13 GHz, such as from about 12.3 GHz to about 13.3 GHz.

For convenience, the architecture of the second band path 820 is depicted in FIG. 8 as receiving a single-ended input. As the person of ordinary skill in the art will readily comprehend, the second band path 820 may be configured to receive a differential input. The second band path 820 may provide a single-ended output or a differential output. As will be discussed below, as depicted in FIG. 8, the second band path 820 provides a differential second intermediate RF signal comprising "I" and "Q" components having a 90° phase shift therebetween.

In one embodiment, as depicted in FIG. 8, the second band path 820 further comprises a second gain stage 824 configured to increase the gain of the second intermediate RF signal. The second gain stage 824 may comprise an inverter and a feedback resistor.

In one embodiment, one or more of the components 822, 823, or 824 of the second band path 820 may be an FDSOI device.

The first multiband receiver 800 also comprises a base band path 830. The base band path 830 comprises a third passive mixer 833 configured to receive the first (differential) intermediate RF signal during a first period of a duty cycle and the second (differential) intermediate RF signal during a second period of the duty cycle. The third passive mixer 833 comprises mixer 833$i$, configured to receive the "I" components of the intermediate RF signals, and mixer 833$q$, configured to receive the "Q" components of the intermediate RF signals. The mixers 833$i$ and 833$q$ may be controlled by control signals $EN_i$ and $EN_q$, respectively, such that the mixers 833$i$ and 833$q$ are only active at desired times during the duty cycle.

As depicted in FIG. 8, in one embodiment, the base band path 830 may further comprise a coupling capacitor 831 between the first and second band paths 810, 820 and the third passive mixer 833. The coupling capacitor 831 may provide high-pass filtering of the intermediate RF signals. Alternatively or in addition, the coupling capacitor 831 may decouple other devices 833, 834 of the base band path 830 from bias induced by the gain stages 814, 824. Alternatively or in addition, the coupling capacitor 831 may block the flow of any direct current signals generated by the passive mixers 813, 823.

The third passive mixer 833 is driven by a third local oscillator signal having a frequency about one-third of the first frequency during the first period, and is driven by a fourth local oscillator signal having a frequency about one-third of the second frequency during the second period. In other words, the frequency of the third local oscillator may be about one-half of the frequency of the first local oscillator driving the first passive mixer 813, and the frequency of the fourth local oscillator may be about one-half of the frequency of the second local oscillator driving the second passive mixer 823.

The third local oscillator signal and the fourth local oscillator signal for the third passive mixer 833 may require lower loading and accordingly may consume less power than other multiband receivers.

In one embodiment, wherein the frequency of the first local oscillator is about 18 GHZ, the frequency of the third local oscillator may be about 9 GHZ, e.g., from 8.08 GHz to 9.83 GHz. In one embodiment, wherein the frequency of the second local oscillator is about 27 GHZ, the frequency of the fourth local oscillator may be about 13 GHz, such as from 12.33 GHZ to 14.5 GHz.

The third and fourth local oscillator signals may be provided by dividing the first and second local oscillator signals at a first frequency divider 851 and a second frequency divider 852, respectively.

The third passive mixer 833 is configured to provide a first differential output signal having a frequency about one-third of the first frequency during the first period, and is configured to provide a second differential output signal having a frequency about one-third of the second frequency during the second period. For example, if the first frequency is about 27 GHZ, the frequency of the first differential output signal may be about 9 GHz, such as from 8.08 GHz to 9.83 GHz. For another example, if the second frequency is about 40 GHz, the frequency of the second differential output signal may be about 13 GHz, such as from 12.3 GHz to 13.3 GHz.

In one embodiment, as depicted in FIG. 8, the base band path 830 may comprise a transimpedance amplifier (TIA) 834 (e.g., TIAs 834$i$ and 834$q$ for particular components of the first and second differential output signals) configured to receive the first differential output signal and the second differential output signal. Each TIA 834$i$, 834$q$ may comprise an inverter, and a resistor and capacitor, which latter two may provide low-pass filtering.

In one embodiment, one or more of the components 831, 833, or 834 of the base band path 830 may be an FDSOI device.

The base band path 830 provides differential output signals 861 to subsequent components of a device comprising the first multiband receiver 800.

As depicted in FIG. 8, the DPLL 840 of the first multiband receiver 800 is configured to provide the first local oscillator signal and the second local oscillator signal. For example, the DPLL 840 may comprise two DCOs, one for each of the first and second band paths, and a multiplexer providing the first local oscillator signal at certain periods of the duty cycle and the second local oscillator signal at other periods of the duty cycle. In other embodiments, not shown, the first multiband receiver 800 may contain two separated DPLLs, one for each of the first and second band paths.

Figure 9:
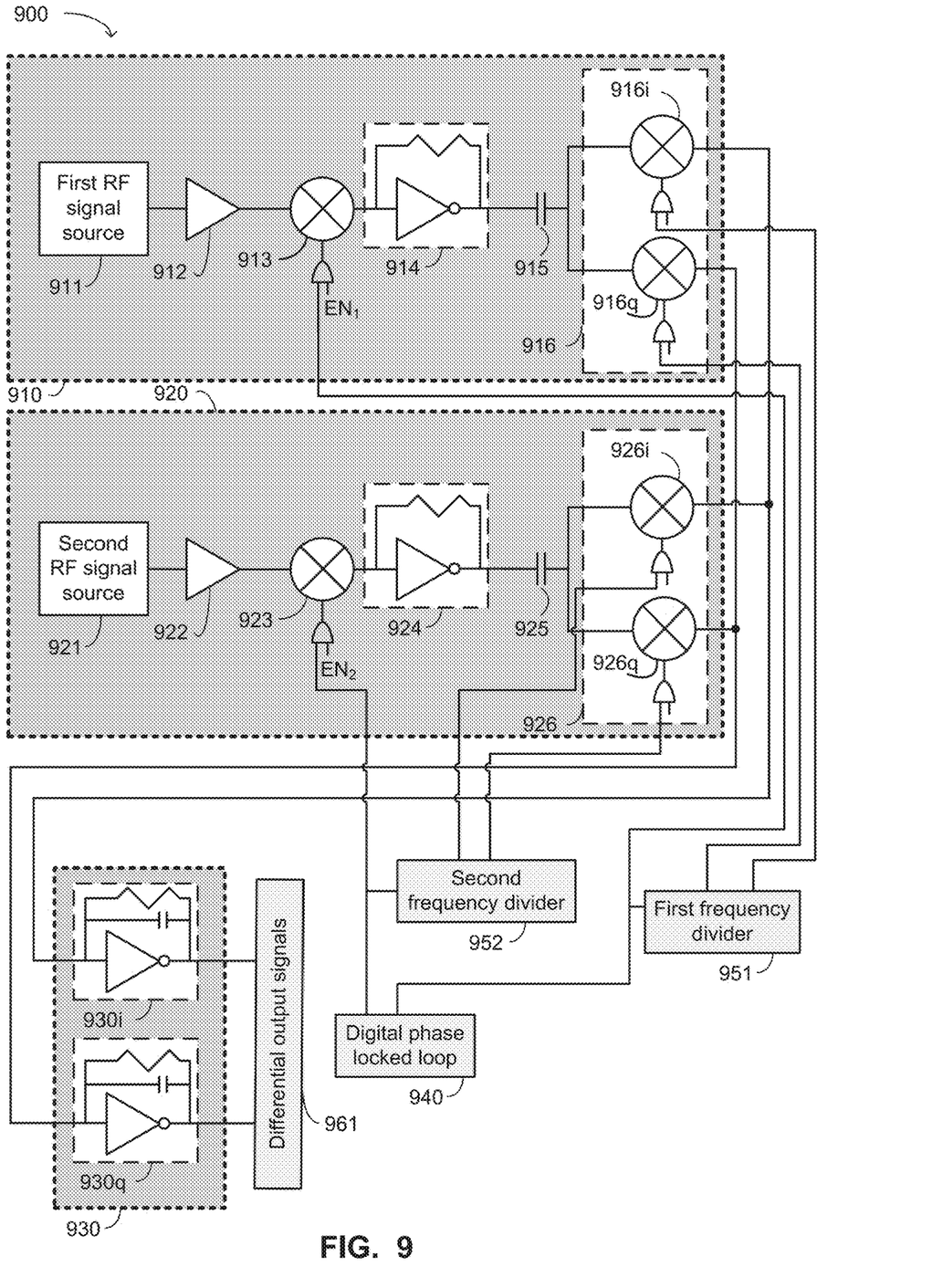
FIG. 9 illustrates a second multiband receiver circuit, in accordance with embodiments herein.

FIG. 9 depicts an implementation of a second multiband receiver 900, in accordance with embodiments herein. Many of the components depicted in FIG. 9 will be the same or similar to components depicted in FIG. 8 and described above. Also, the first frequency, the second frequency, and the frequencies of the local oscillators will be the same or similar to those described above. Accordingly, the following description of FIG. 9 will focus on differences between FIG. 8 and FIG. 9.

In FIG. 9, the first band path 910 may comprise a first RF signal source 911 providing a first input RF signal having a first frequency; a first low noise amplifier 912; a first passive mixer 913 driven by a first local oscillator signal having a frequency about two-thirds of the first frequency and controlled by a first control signal $EN_1$, wherein the first passive mixer 913 is configured to provide a first intermediate RF signal having a frequency about one-third of the first frequency; a first gain stage 914; and a first coupling capacitor 915.

The first band path 910 of the second multiband receiver 900 may also comprise a second passive mixer 916 configured to receive the first intermediate RF signal. The first intermediate RF signal may be differential, and as depicted, the second passive mixer 916 may comprise two mixing components 916i and 916q, for each of the "I" and "Q" components of the differential first intermediate RF signal, respectively. The mixing components 916i and 916q may each be controlled by an appropriate control signal (not shown for the sake of brevity).

The second passive mixer 916 is driven by a second local oscillator signal having a frequency about one-third of the first frequency. The second passive mixer 916 is configured to provide a first differential output signal having a frequency about one-third of the first frequency.

The second band path 920 may also comprise a second RF signal source 921 providing a second input RF signal having a second frequency; a second low noise amplifier 922; a third passive mixer 923 driven by a third local oscillator signal having a frequency about two-thirds of the second frequency, wherein the third passive mixer 923 is configured to provide a second intermediate RF signal having a frequency about one-third of the second frequency; a second gain stage 924; and a second coupling capacitor 925.

The second band path 920 also comprises a fourth passive mixer 926 configured to receive the second intermediate RF signal. The fourth passive mixer 926 is driven by a fourth local oscillator signal having a frequency about one-third of the second frequency. The fourth passive mixer 926 is configured to provide a second differential output signal having a frequency about one-third of the second frequency.

As will be appreciated, a notable difference between FIG. 8 and FIG. 9 is that, in FIG. 8, the passive mixer 833 (comprising mixing components 833i and 833q) down-converts the frequencies of both the first and second intermediate RF signals, whereas in FIG. 9, the passive mixer 916 down-converts the frequency of the first intermediate RF signal and the passive mixer 926 down-converts the frequency of the second intermediate RF signal.

The second multiband receiver 900 may also comprise a DPLL 940 configured to provide the first local oscillator signal and the third local oscillator signal. The second multiband receiver 900 may also comprise a first frequency divider 951 configured to receive the first local oscillator signal and provide the second local oscillator signal. The second multiband receiver 900 may also comprise a second frequency divider 952 configured to receive the third local oscillator signal and provide the fourth local oscillator signal.

The second multiband receiver 900 may also comprise a base band path comprising a transimpedance amplifier 930 configured to receive the first differential output signal from the first band path 910 and the second differential output signal from the second band path 920, and provide differential output signals 961.

Figure 10:
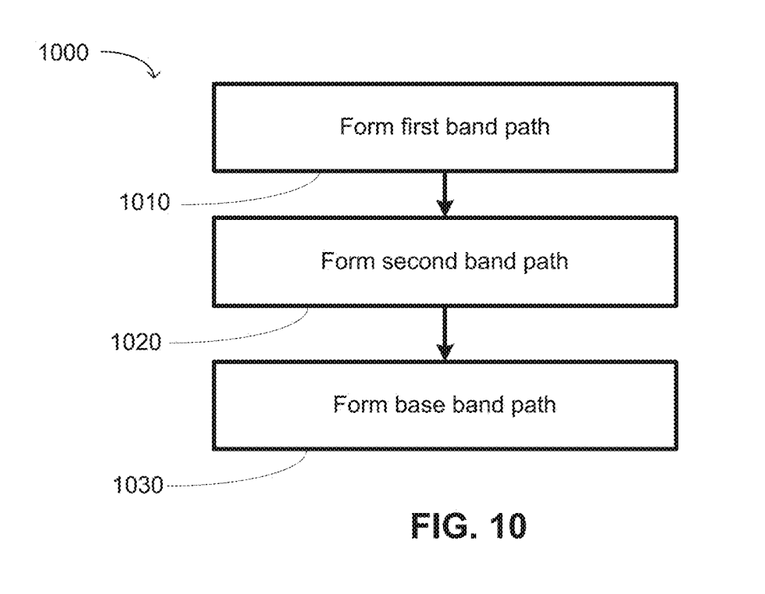
FIG. 10 illustrates a flowchart of a method, in accordance with embodiments herein.

FIG. 10 provides a flowchart of a method 1000, in accordance with embodiments herein. As depicted, the method 1000 comprises forming (at 1010) a first band path. In one embodiment, the first band path comprises a first passive mixer configured to receive a first input radio frequency (RF) signal having a first frequency, wherein the first passive mixer is driven by a first local oscillator signal having a frequency about two-thirds of the first frequency, and is configured to provide a first intermediate RF signal having a frequency about one-third of the first frequency. In one embodiment, the first frequency is about 28 GHz.

In one embodiment, forming (at 1010) comprises forming at least one fully depleted silicon on insulator (FDSOI) device.

Forming (at 1010) may comprise forming a first low noise amplifier, wherein the first RF signal is provided by the first low noise amplifier to the first passive mixer. Alternatively, or in addition, forming (at 1010) may comprise forming a first gain stage configured to increase the gain of the first intermediate RF signal.

The method 1000 also comprises forming (at 1020) a second band path. In one embodiment, the second band path comprises a second passive mixer configured to receive a second input RF signal having a second frequency, wherein the second passive mixer is driven by a second local oscillator signal having a frequency about two-thirds of the second frequency, and is configured to provide a second intermediate RF signal having a frequency about one-third of the second frequency. In one embodiment, the second frequency is about 40 GHz.

In one embodiment, forming (at 1020) comprises forming at least one FDSOI device.

Forming (at 1020) may comprise forming a second low noise amplifier, wherein the second RF signal is provided by the second low noise amplifier to the second passive mixer. Alternatively or in addition, forming (at 1020) may comprise forming a second gain stage configured to increase the gain of the second intermediate RF signal.

The method 1000 also comprises forming (at 1030) a base band path. In one embodiment, the base band path comprises a third passive mixer configured to receive the first intermediate RF signal during a first period of a duty cycle and the second intermediate RF signal during a second period of the duty cycle, wherein the third passive mixer is driven by a third local oscillator signal having a frequency about one-third of the first frequency during the first period, is driven by a fourth local oscillator signal having a frequency about one-third of the second frequency during the second period, is configured to provide a first differential output signal having a frequency about one-third of the first frequency during the first period, and is configured to provide a second differential output signal having a frequency about one-third of the second frequency during the second period.

In one embodiment, forming (at 1030) comprises forming at least one FDSOI device.

Forming (at 1030) may comprise forming a coupling capacitor between the first and second band paths and the third passive mixer. Alternatively or in addition, forming (at 1030) may comprise forming a transimpedance amplifier configured to receive the first differential output signal and the second differential output signal.

The method 1000 may also comprise forming a digital phase locked loop configured to provide the first local oscillator signal and the second local oscillator signal.

The method 1000 may also comprise forming a first frequency divider configured to receive the first local oscillator signal and provide the third local oscillator signal; and a second frequency divider configured to receive the second local oscillator signal and provide the fourth local oscillator signal.

Figure 11:
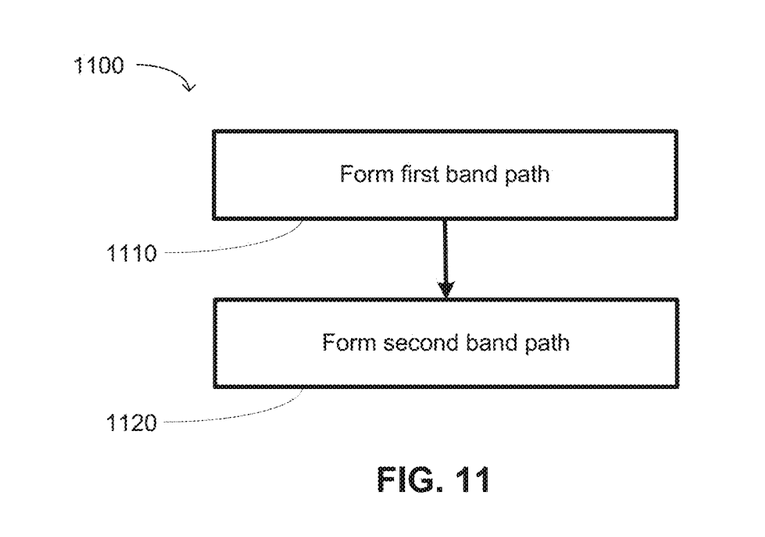
FIG. 11 illustrates a flowchart of a method, in accordance with embodiments herein.

FIG. 11 provides a flowchart of a method 1100, in accordance with embodiments herein. As depicted, the method 1100 comprises forming (at 1110) a first band path.

The first band path may comprise a first passive mixer configured to receive a first input radio frequency (RF) signal having a first frequency, wherein the first passive mixer is driven by a first local oscillator signal having a frequency about two-thirds of the first frequency, and is configured to provide a first intermediate RF signal having a frequency about one-third of the first frequency; and a second passive mixer configured to receive the first intermediate RF signal, wherein the second passive mixer is driven by a second local oscillator signal having a frequency about one-third of the first frequency, and is configured to provide a first differential output signal having a frequency about one-third of the first frequency. In one embodiment, the first frequency is about 28 GHz.

Forming (at 1110) may also comprise forming a first low noise amplifier, wherein the first RF signal is provided by the first low noise amplifier to the first passive mixer. Alternatively or in addition, forming (at 1110) may comprise forming one or both of a first gain stage configured to increase the gain of the first intermediate RF signal, and a first coupling capacitor between the first gain stage and the second passive mixer.

The method 1100 also comprises forming (at 1120) a second band path. The second band path may comprise a third passive mixer configured to receive a second input RF signal having a second frequency, wherein the third passive mixer is driven by a third local oscillator signal having a frequency about two-thirds of the second frequency, and is configured to provide a second intermediate RF signal having a frequency about one-third of the second frequency; and a fourth passive mixer configured to receive the second intermediate RF signal, wherein the fourth passive mixer is driven by a fourth local oscillator signal having a frequency about one-third of the second frequency, and is configured to provide a second differential output signal having a frequency about one-third of the second frequency. In one embodiment, the second frequency is about 40 GHz.

Forming (at 1120) may also comprise forming a second low noise amplifier, wherein the second RF signal is provided by the second low noise amplifier to the third passive mixer. Alternatively or in addition, forming (at 1120) may comprise forming one or both of a second gain stage configured to increase the gain of the second intermediate RF signal, and a second coupling capacitor between the second gain stage and the third passive mixer.

The method 1100 may also comprise forming a digital phase locked loop configured to provide the first local oscillator signal and the third local oscillator signal.

The method 1100 may also comprise forming a first frequency divider configured to receive the first local oscillator signal and provide the second local oscillator signal; and a second frequency divider configured to receive the third local oscillator signal and provide the fourth local oscillator signal.

The method 1100 may also comprise forming a base band path comprising a transimpedance amplifier configured to receive the first differential output signal and the second differential output signal.

Figure 12:
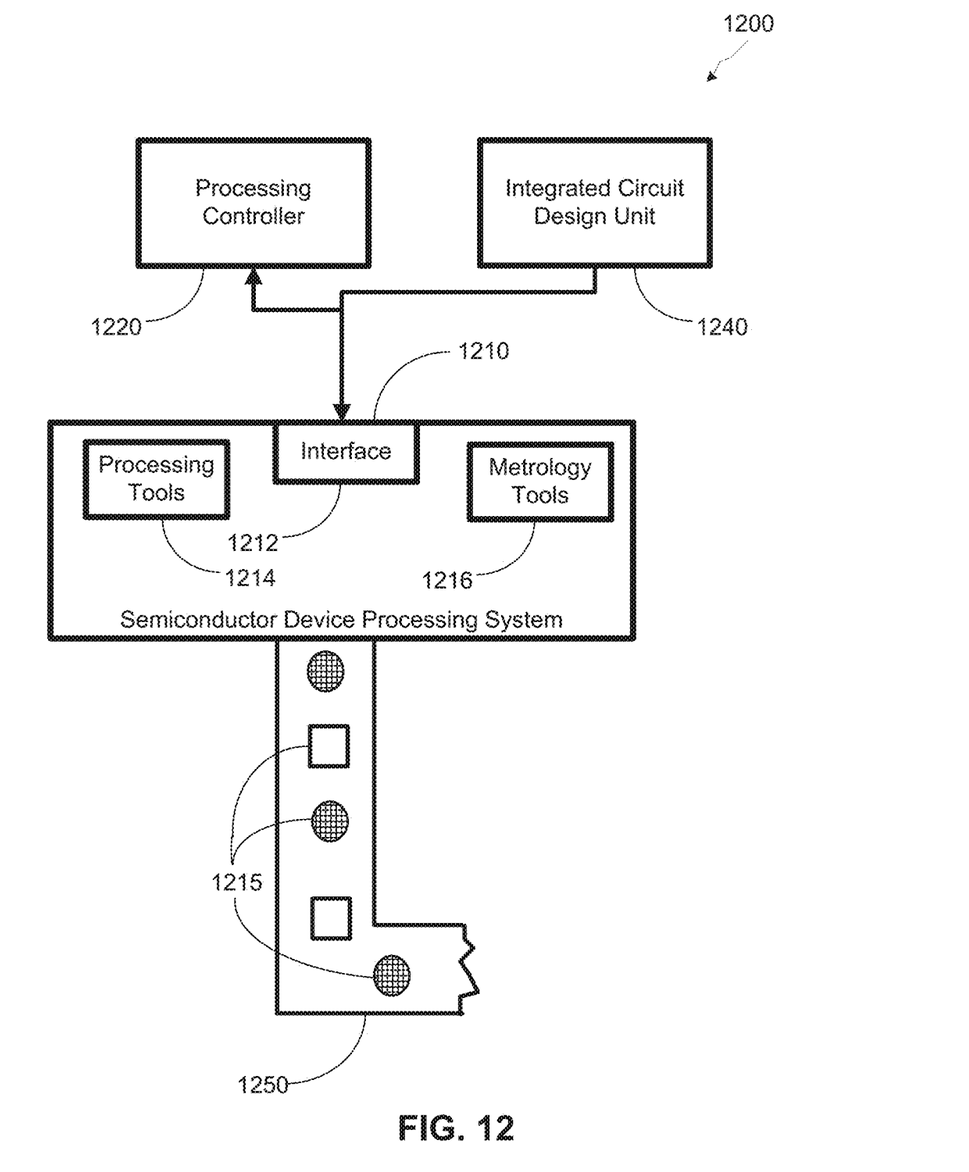
FIG. 12 illustrates a stylized depiction of a system for fabricating a semiconductor device, in accordance with embodiments herein.

Turning now to FIG. 12, a stylized depiction of a system 1200 for fabricating a semiconductor device package comprising a power amplifier circuit, in accordance with embodiments herein, is illustrated. A system 1200 of FIG. 12 may comprise a semiconductor device processing system 1210 and an integrated circuit design unit 1240. The semiconductor device processing system 1210 may manufacture integrated circuit devices based upon one or more designs provided by the integrated circuit design unit 1240.

The semiconductor device processing system 1210 may comprise various processing stations, such as etch process stations, photolithography process stations, CMP process stations, etc. Each of the processing stations may comprise one or more processing tools 1214 and or metrology tools 1216. Feedback based on data from the metrology tools 1216 may be used to modify one or more process parameters used by the processing tools 1214 for performing process steps.

The semiconductor device processing system 1210 may also comprise an interface 1212 that is capable of providing communications between the processing tools 1214, the metrology tools 1216, and a controller, such as the processing controller 1220. One or more of the processing steps performed by the semiconductor device processing system 1210 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1210 may produce integrated circuits on a medium, such as silicon wafers. More particularly, the semiconductor device processing system 1210 may produce integrated circuits comprising a multiband receiver, such as the first multiband receiver 800 depicted in FIG. 8 or the second multiband receiver 900 depicted in FIG. 9.

The production of integrated circuits by the semiconductor device processing system 1210 may be based upon the circuit designs provided by the integrated circuit design unit 1240. The semiconductor device processing system 1210 may provide processed integrated circuits/devices 1215 on a transport mechanism 1250, such as a conveyor system. In some embodiments, the conveyor system may be sophisticated clean room transport systems that are capable of transporting semiconductor wafers. In one embodiment, the semiconductor device processing system 1210 may implement a plurality of processing steps, e.g., the steps of the method 1000 described above and depicted in FIG. 10.

In some embodiments, the items labeled "1215" may represent individual wafers, and in other embodiments, the items 1215 may represent a group of semiconductor wafers, e.g., a "lot" of semiconductor wafers. The integrated circuit or device 1215 may comprise a transistor, a capacitor, a resistor, a memory cell, a processor, and/or the like.

The integrated circuit design unit 1240 of the system 1200 is capable of providing a circuit design that may be manufactured by the semiconductor device processing system 1210. This may include information regarding whether a first multiband receiver 800 or a second multiband receiver 900 is to be manufactured; what signal frequency/ies are to be provided by a DPLL 840/1040; etc.

The integrated circuit design unit 1240 may be capable of determining the number of devices (e.g., processors, memory devices, etc.) to place in a device package. Based upon such details of the devices, the integrated circuit design unit 1240 may determine specifications of the devices that are to be manufactured. Based upon these specifications, the integrated circuit design unit 1240 may provide data for manufacturing a semiconductor device package described herein.

The system 1200 may be capable of performing analysis and manufacturing of various products involving various technologies. For example, the system 1200 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1200 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus, comprising:
a first band path comprising a first passive mixer configured to receive a first input radio frequency (RF) signal, wherein the first passive mixer is driven by a first local oscillator signal and is configured to provide a first intermediate RF signal;
a second band path comprising a second passive mixer configured to receive a second input RF signal, wherein the second passive mixer is driven by a second local oscillator signal and is configured to provide a second intermediate RF signal; and
a base band path comprising a third passive mixer configured to receive the first intermediate RF signal during a first period of a duty cycle and the second intermediate RF signal during a second period of the duty cycle, and to provide a first differential output signal during the first period and a second differential output signal during the second period.

2. The apparatus of claim 1, wherein:
the first input RF signal has a first frequency;
the first local oscillator signal has a frequency about two-thirds of the first frequency;
the first intermediate RF signal has a frequency about one-third of the first frequency;
the second input RF signal has a second frequency;
the second local oscillator signal has a frequency about two-thirds of the second frequency;
the second intermediate RF signal has a frequency about one-third of the second frequency;
the third passive mixer is driven by a third local oscillator signal during the first period, wherein the third local oscillator signal has a frequency about one-third of the first frequency;
the third passive mixer is driven by a fourth local oscillator signal during the second period, wherein the fourth local oscillator signal has a frequency about one-third of the second frequency;
the first differential output signal has a frequency about one-third of the first frequency; and
the second differential output signal has a frequency about one-third of the second frequency.

3. The apparatus of claim 2, wherein the first frequency is about 28 GHz and the second frequency is about 40 GHz.

4. The apparatus of claim 1, further comprising:
a digital phase locked loop configured to provide the first local oscillator signal and the second local oscillator signal.

5. The apparatus of claim 2, further comprising:
a first frequency divider configured to receive the first local oscillator signal and provide the third local oscillator signal; and
a second frequency divider configured to receive the second local oscillator signal and provide the fourth local oscillator signal.

6. The apparatus of claim 1, wherein:
the first band path further comprises a first low noise amplifier, wherein the first RF signal is provided by the first low noise amplifier to the first passive mixer; and
the second band path further comprises a second low noise amplifier, wherein the second RF signal is provided by the second low noise amplifier to the second passive mixer.

7. The apparatus of claim 1, wherein:
the first band path further comprises a first gain stage configured to increase the gain of the first intermediate RF signal;
the second band path further comprises a second gain stage configured to increase the gain of the second intermediate RF signal; and
the base band path further comprises a coupling capacitor between the first and second band paths and the third passive mixer, and a transimpedance amplifier configured to receive the first differential output signal and the second differential output signal.

8. An apparatus, comprising:
a first band path, comprising:
a first passive mixer configured to receive a first input radio frequency (RF) signal, wherein the first passive mixer is driven by a first local oscillator signal, and is configured to provide a first intermediate RF signal; and
a second passive mixer configured to receive the first intermediate RF signal, wherein the second passive mixer is driven by a second local oscillator signal, and is configured to provide a first differential output signal; and
a second band path, comprising:
a third passive mixer configured to receive a second input RF signal, wherein the third passive mixer is driven by a third local oscillator signal, and is configured to provide a second intermediate RF signal; and
a fourth passive mixer configured to receive the second intermediate RF signal, wherein the fourth passive mixer is driven by a fourth local oscillator signal, and is configured to provide a second differential output signal.

9. The apparatus of claim 8, wherein:
the first input RF signal has a first frequency;
the first local oscillator signal has a frequency about two-thirds of the first frequency;
the first intermediate RF signal has a frequency about one-third of the first frequency;
the second input RF signal has a second frequency;
the second local oscillator signal has a frequency about two-thirds of the second frequency;
the second intermediate RF signal has a frequency about one-third of the second frequency; and
the third local oscillator signal has a frequency about one-third of the first frequency;
the fourth local oscillator signal has a frequency about one-third of the second frequency;
the first differential output signal has a frequency about one-third of the first frequency; and the second differential output signal has a frequency about one-third of the second frequency.

10. The apparatus of claim 9, wherein the first frequency is about 28 GHz and the second frequency is about 40 GHz.

11. The apparatus of claim 9, further comprising:
a digital phase locked loop configured to provide the first local oscillator signal and the third local oscillator signal.

12. The apparatus of claim 11, further comprising:
a first frequency divider configured to receive the first local oscillator signal and provide the second local oscillator signal; and
a second frequency divider configured to receive the third local oscillator signal and provide the fourth local oscillator signal.

13. The apparatus of claim 9, wherein:
the first band path further comprises a first low noise amplifier, wherein the first RF signal is provided by the first low noise amplifier to the first passive mixer; and
the second band path further comprises a second low noise amplifier, wherein the second RF signal is provided by the second low noise amplifier to the third passive mixer.

14. The apparatus of claim 9, wherein:
the first band path further comprises a first gain stage configured to increase the gain of the first intermediate RF signal, and a first coupling capacitor between the first gain stage and the second passive mixer; and
the second band path further comprises a second gain stage configured to increase the gain of the second intermediate RF signal, and a second coupling capacitor between the second gain stage and the third passive mixer.

15. The apparatus of claim 9, further comprising:
a base band path comprising a transimpedance amplifier configured to receive the first differential output signal and the second differential output signal.

16. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
form a first band path comprising a first passive mixer configured to receive a first input radio frequency (RF) signal, wherein the first passive mixer is driven by a first local oscillator signal, and is configured to provide a first intermediate RF signal;
form a second band path comprising a second passive mixer configured to receive a second input RF signal, wherein the second passive mixer is driven by a second local oscillator signal, and is configured to provide a second intermediate RF signal; and
form a base band path comprising a third passive mixer configured to receive the first intermediate RF signal during a first period of a duty cycle and the second intermediate RF signal during a second period of the duty cycle and to provide a first differential output signal during the first period, and a second differential output signal during the second period.

17. The system of claim 16, wherein:
the first input RF signal has a first frequency;
the first local oscillator signal has a frequency about two-thirds of the first frequency;
the first intermediate RF signal has a frequency about one-third of the first frequency;
the second input RF signal has a second frequency;
the second local oscillator signal has a frequency about two-thirds of the second frequency;
the second intermediate RF signal has a frequency about one-third of the second frequency; and
the third passive mixer is driven by a third local oscillator signal during the first period, wherein the third local oscillator signal has a frequency about one-third of the first frequency;
the third passive mixer is driven by a fourth local oscillator signal during the second period, wherein the fourth local oscillator signal has a frequency about one-third of the second frequency;
the first differential output signal has a frequency about one-third of the first frequency; and
the second differential output signal has a frequency about one-third of the second frequency.

18. The system of claim 16, wherein the semiconductor device processing system is further adapted to:
form a digital phase locked loop configured to provide the first local oscillator signal and the second local oscillator signal.

19. The system of claim 18, wherein the semiconductor device processing system is further adapted to:
form a first frequency divider configured to receive the first local oscillator signal and provide the third local oscillator signal; and
form a second frequency divider configured to receive the second local oscillator signal and provide the fourth local oscillator signal.

20. The system of claim 16, wherein the semiconductor device processing system is further adapted to:
form a first gain stage in the first band path, wherein the first gain stage is configured to increase the gain of the first intermediate RF signal;
form a second gain stage in the second band path, wherein the second gain stage is configured to increase the gain of the second intermediate RF signal; and
form a coupling capacitor in the base band path between the first and second band paths and the third passive mixer, and
form a transimpedance amplifier in the base band path, wherein the transimpedance amplifier is configured to receive the first differential output signal and the second differential output signal.

* * * * *